(12) United States Patent
Tucker (10) Patent No.: US 10,069,480 B2
(45) Date of Patent: Sep. 4, 2018

(54) ACTIVE FILTER DEVICE AND CIRCUIT ARRANGEMENT COMPRISING AN ACTIVE FILTER DEVICE

(71) Applicant: EPCOS AG, Munich (DE)

(72) Inventor: Andrew Tucker, Solothurn (CH)

(73) Assignee: EPCOS AG, Munich (DE)

( * ) Notice: Subject to any disclaimer, the term of this patent is extended or adjusted under 35 U.S.C. 154(b) by 56 days.

(21) Appl. No.: 15/310,011

(22) PCT Filed: Apr. 28, 2015

(86) PCT No.: PCT/EP2015/059182
§ 371 (c)(1),
(2) Date: Nov. 9, 2016

(87) PCT Pub. No.: WO2015/173006
PCT Pub. Date: Nov. 19, 2015

(65) Prior Publication Data
US 2017/0179931 A1 Jun. 22, 2017

(30) Foreign Application Priority Data
May 12, 2014 (EP) .................... 14167918

(51) Int. Cl.
*H03B 1/00* (2006.01)
*H03H 11/12* (2006.01)
(Continued)

(52) U.S. Cl.
CPC ........... *H03H 11/126* (2013.01); *H02K 11/02* (2013.01); *H02M 1/12* (2013.01); *H02M 1/44* (2013.01)

(58) Field of Classification Search
CPC .. H04N 5/23248; H04N 5/23287; G03B 5/00; A61B 5/02405; A61B 5/6803
See application file for complete search history.

(56) References Cited

U.S. PATENT DOCUMENTS 5,300,896 A * 4/1994 Suesserman ........ H03F 3/45475
330/260
7,659,797 B2 2/2010 Tucker
(Continued)

FOREIGN PATENT DOCUMENTS

| CN | 101507112 A | 8/2009 |
| GB | 2326995 A | 1/1999 |

(Continued)

OTHER PUBLICATIONS

Wang, P. et al., "Research and Design of a Common Mode Hybrid EMI Filter for Switch-mode Power Supply," 2009 3rd International Conference on Power Electronics Systems and Applications, May 20-22, 2009, 4 pages.

(Continued)

*Primary Examiner* — Sibin Chen
(74) *Attorney, Agent, or Firm* — Slater Matsil, LLP (57) ABSTRACT

An active filter device and a circuit arrangement comprising an active filter device are disclosed. In an embodiment the active filter device includes sensor terminals for applying a sensor signal depending on a sensed noise signal, an output terminal for providing a correction signal that is suitable for reducing the noise signal, a signal source adapted for generating a correction signal and a high-pass filter coupled between the sensor terminals and the signal source, wherein the correction signal is generated with a dependence on a high-pass filtered sensor signal.

12 Claims, 7 Drawing Sheets

(51) Int. Cl.
*H02M 1/12* (2006.01)
*H02M 1/44* (2007.01)
*H02K 11/02* (2016.01)

(56) References Cited

U.S. PATENT DOCUMENTS

| | | | |
|---|---|---|---|
| 8,823,448 B1 * | 9/2014 | Shen | H04B 15/00 |
| | | | 327/552 |
| 2005/0280405 A1 | 12/2005 | Bray | |
| 2015/0003124 A1 * | 1/2015 | Sakai | H02M 1/12 |
| | | | 363/37 |

FOREIGN PATENT DOCUMENTS

| | | |
|---|---|---|
| JP | 2001119258 A | 4/2001 |
| WO | 2008020029 A1 | 2/2008 |
| WO | 2014048471 A1 | 4/2014 |

OTHER PUBLICATIONS

Wang, S. et al., "Investigation of Hybrid EMI Filters for Common-Mode EMI Suppression in a Motor Drive System," IEEE Transactions on Power Electronics, vol. 25, No. 4, Apr. 2010, pp. 1034-1045.

* cited by examiner

ACTIVE FILTER DEVICE AND CIRCUIT ARRANGEMENT COMPRISING AN ACTIVE FILTER DEVICE

This patent application is a national phase filing under section 371 of PCT/EP2015/059182, filed Apr. 28, 2015, which claims the priority of European patent application 14167918.3, filed May 12, 2014, each of which is incorporated herein by reference in its entirety.

TECHNICAL FIELD

The present invention is directed to an active filter device. The invention is further directed to a filtering circuit arrangement including the active filter device. The filtering circuit arrangement may serve as a power line filter, which may be connected between a power supply network and an electrically operated appliance.

BACKGROUND

Filters may be used on power lines for the mitigation of electromagnetic noise, or earth leakage current, which may be generated by switching frequencies, for example.

For instance, on motor drive output lines, earth leakage current can result in a rapid degradation of motor bearings.

In many applications, a system switching frequency exists in the range of 1 KHz to 150 kHz. In the case of motor drives, switching frequencies are typically in the range of 1 kHz to 16 kHz and in the case of power supplies, UPS and power conversion they are typically in the range of 10 kHz to 200 kHz.

It is desirable to find efficient ways to remove these disturbing frequencies, and associated harmonics, from both input and output lines.

Conventional filter solutions for mitigating electromagnetic noise on power lines, which are generated for example by the switching frequencies, are passive filters constructed with inductive and capacitive elements and resistors.

Power electronic equipment may employ line filtering that is constructed with such inductive and capacitive elements in order to attenuate line disturbances. The impedance of these passive elements is frequency dependent. In order to achieve the desired attenuation, the passive elements are often large and expensive, especially at low frequencies.

More compact filter solutions are desired, in particular in the frequency range of 1 kHz to 150 kHz where, in addition to switching frequencies, further phenomena in the field of electromagnetic compatibility (EMC) exist such as: spurious tripping of residual current devices (RCDs), disturbance to power line communications, and more generally earth leakage current.

Suitable filters for this purpose may either be built to be ever larger and more expensive; or where this becomes too extreme, the problem is ignored altogether.

WO 2014/048471 A1 describes an EMC filtering device comprising an active filtering section and a passive bandwidth filtering section. The passive and active parts of the filter are mutually beneficial such that the resultant filter has a hybrid nature, is small, and has a lower cost than a passive filter solution alone.

SUMMARY OF THE INVENTION

Embodiments of the invention provide a compact filter device.

Various embodiments comprise an the active filter device including sensor terminals for applying a sensor signal depending on a sensed noise signal, an output terminal for providing a correction signal that is suitable for reducing the noise signal, a signal source being adapted for generating the correction signal, a high-pass filter being coupled between the sensor terminals and the signal source, wherein the correction signal is generated with dependence on the high-pass filtered sensor signal.

An active filter is a type of analog electronic filter that includes active components such as an amplifier. The use of active components allows for a compact design of the filter device, on the one hand. One the other hand, a power supply for the active components is required.

The sensor terminals may be terminals for coupling a separate sensor component to the filter device. Alternatively, the sensor terminals are parts of a sensor that is an integral part of the filter device.

Coupling two components means that the components are electrically connected by a conductive joint, e.g. a conductor line, or by at least one further component that is coupled between the components, e.g. a resistor or a resistor-and-capacitor-network. Connecting two components means that the components are directly electrically connected by a conductive joint.

The signal source may comprise an amplifier for proving the correction signal. The filter device recognises the importance of a high gain bandwidth for the amplifier and allows a correct frequency response of the amplifier. The use of a high-pass filter at the input of the signal source including the amplifier allows the production of a frequency response, which, in particular, has a very flat stop band, a corner frequency without ringing and a rapid transition to the pass band. The signal is damped in order to avoid undesirable ringing of the signal in the time domain by means of appropriated formed filter frequency response. Without a high pass filter at the amplifier input, the voltage or current dynamic range of the amplifier is too easily saturated.

In one embodiment, the noise signal, the correction signal and the signal source are a noise current, a correction current and a current source, respectively. In other words, the filter device operates on the principle of current compensation. Alternatively, the noise signal, the correction signal and the signal source are a noise voltage, a correction voltage and a voltage source, respectively. In other words, the filter device operates on the principle of voltage compensation.

The active filter device forms a feed-forward control where the correction signal depends on the sensed noise signal. Such a control system that has only feed-forward behaviour responds to its controlling high-pass filtered sensor signal in a predefined way without responding to how the output reacts. The signal source acts in such a manner that the correction signal compensates or nearly compensates the noise signal. In other words, their sum is equal or nearly equal to zero.

In one embodiment, the signal source comprises a unity gain amplifier means, which essentially provides the input voltage at the output. The unity gain amplifier means may comprise an operational amplifier with a closed loop feedback. In one embodiment, the operational amplifier has a non-inverting input, an inverting input and an output, the latter being coupled to the inverting input. An output of the high-pass filter is coupled to the non-inverting input. In one embodiment, a buffer amplifier or a multitude of buffer amplifiers that are coupled in parallel are coupled between the output and the inverting input of the operational amplifier.

The use of amplifiers with a very large bandwidth and open loop gain-bandwidth product results in a very linear and clean, EMC-wise, residual signal.

The high pass filter comprises a bootstrap connection where a part of the output signal of an amplifier stage is applied to the input. In one embodiment, the bootstrap connection comprises a dc blocking capacitor being coupled in series with a resistor and a capacitor that are coupled in parallel. Other components in the bootstrap connection are possible.

The filter device may include a power supply unit coupled to the unity gain amplifier means, and power supply means terminals for applying a voltage to the power supply unit. The power supply unit allows supply of power to the active components of the filter device.

The integration of all aforementioned components into one compact and self-contained block may form a filter device module. Signal cancellation can be achieved with this block module together with a sensing device that is coupled with the module. In one embodiment, such a block module may provide current cancellation when connected to a suitable current transformer.

Alternatively, a module may be built in such a manner that it includes further components, e.g. the sensing device and/or further passive filter components. Although such a filter which includes passive filter elements it is still considered as an active filter device.

The active filter device may be comprised of a circuit arrangement connectable between a power supply network and an electrically operated appliance. The circuit arrangement may further comprise a current sensor being coupled to the signal sensor terminals and comprising a current transformer. The sensor may be a component coupled with the filter device module. Alternatively, the circuit arrangement may comprise a voltage sensor.

In one embodiment, the output terminal of the active filter device is coupled with a summing point between the current transformer and the connection to the power network or the electrically operated appliance. Providing the correction current at the summing point allows reduction of the sensed noise current, which causes compensation of the disturbances.

The power network may include one of: a dc power line an ac power line; a single phase power line and a multiple phase power line. Additionally, the power network may include one of: a power supply line; and a power output line, such as a motor feed cable.

There is a broad field of application for the above-mentioned filter device and the circuit arrangement. Potential use may be in the industrial, domestic, medical and automotive fields. It may be used for both input and output filtering. It may be used on single wire and double wire, low and high voltage dc supplies, single phase, three phase and three phase neutral, low and medium voltage ac supplies. In the field of automotive voltage dc supplies it may be used where the circuit arrangement is connected to an EMC filtering device connected to an electric driven motor.

BRIEF DESCRIPTION OF THE DRAWINGS

Features which are described herein above and below in conjunction with different aspects or embodiments, may also apply to other aspects and embodiments. Further features and advantageous embodiments of the subject-matter of the disclosure will become apparent from the following description of the exemplary embodiments in conjunction with the figures, in which.

DETAILED DESCRIPTION OF ILLUSTRATIVE EMBODIMENTS

Figure 1:
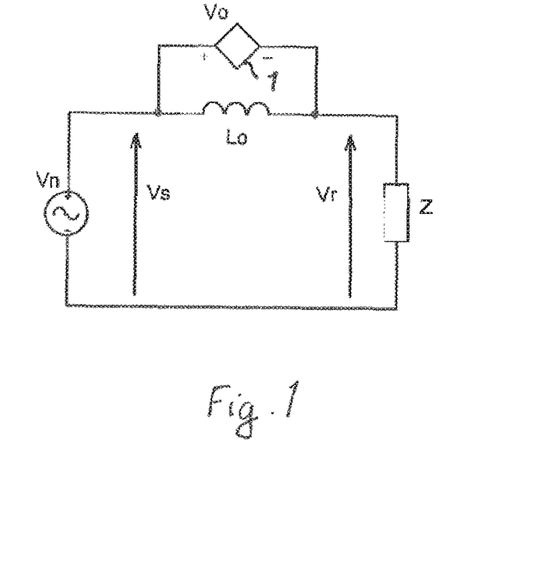
FIG. 1 shows a circuit diagram of an exemplary embodiment of a power line with voltage cancellation.
Figure 2:
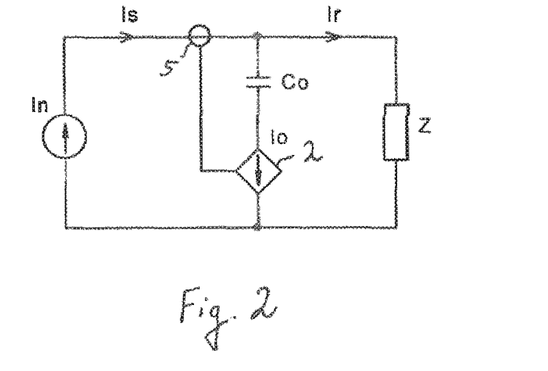
FIG. 2 shows a circuit diagram of an exemplary embodiment of a power line with current cancellation.

FIGS. 1 and 2 illustrate the method of filtering operation, which works in principle as follows. The disturbance on a power line, which is a noise signal, is detected by a sensing device which passes a sensor signal, via a high pass filter, to an amplifying device serving as the signal source. It produces an output signal serving as a correction signal which, over a designated bandwidth, has very nearly the same phase and magnitude as that detected by the sensing device. This can be described as a unity-gain feed-forward control path, wherein the gain is unity. Feed-forward is a term describing passing a controlling signal from a source to a load. A control system that has only feed-forward behaviour responds to its control signal in a pre-defined way without responding to how the load reacts.

The inverse of the output signal is summed with the sensed signal at, or over, a suitable summing point, or component, on the power line. The resulting signal on the power line, after summing, is reduced very nearly to zero.

The disturbance cancellation can be realised as voltage or current type as shown in FIGS. 1 and 2, respectively.

FIG. 1 shows a circuit diagram of a power line with voltage cancellation. The circuit comprises a voltage source Vn which provides a voltage supply for a voltage compensation means 1 connected in parallel with an inductive impedance Lo and an load impedance Z, connected in series with the aforementioned voltage compensation means 1 and the inductive impedance Lo. The voltage compensation means 1 is adapted for sensing a noise voltage Vs on the voltage supply side and then providing a voltage Vo in dependence on the sensed noise voltage Vs. The voltage cancellation is achieved over the inductive impedance Lo to ensure power line current continuity.

The resulting voltage Vr is the sum of the sensed noise voltage Vs and the compensation voltage Vo, which should be as close as possible to zero. In other words, Vr=Vs−Vo≈0 when Vs≈Vs where Vs, Vo and Vr are all voltage vectors.

FIG. 2 shows a circuit diagram of a power line with current cancellation. The circuit comprises a current source In which provides current supply for a current compensation means 2 connected in series with a capacitive impedance Co and an load impedance Z that is connected in parallel with the aforementioned current compensation means 2 and the capacitive impedance Co. The current compensation means 2 is adapted for detecting a noise current Is of the current source In by means of a sensor 5 and then providing a compensation current Io in dependence of the detected noise current Is. The current cancellation is achieved via the capacitive impedance Co to ensure power line voltage isolation.

The resulting current Ir is the sum of the sensed current Is and the compensation current Io, which should be as close as possible to zero. In other words, Ir=Is−Io≈0 when Is≈Is where Is, Io and Ir are all current vectors.

Figure 3:
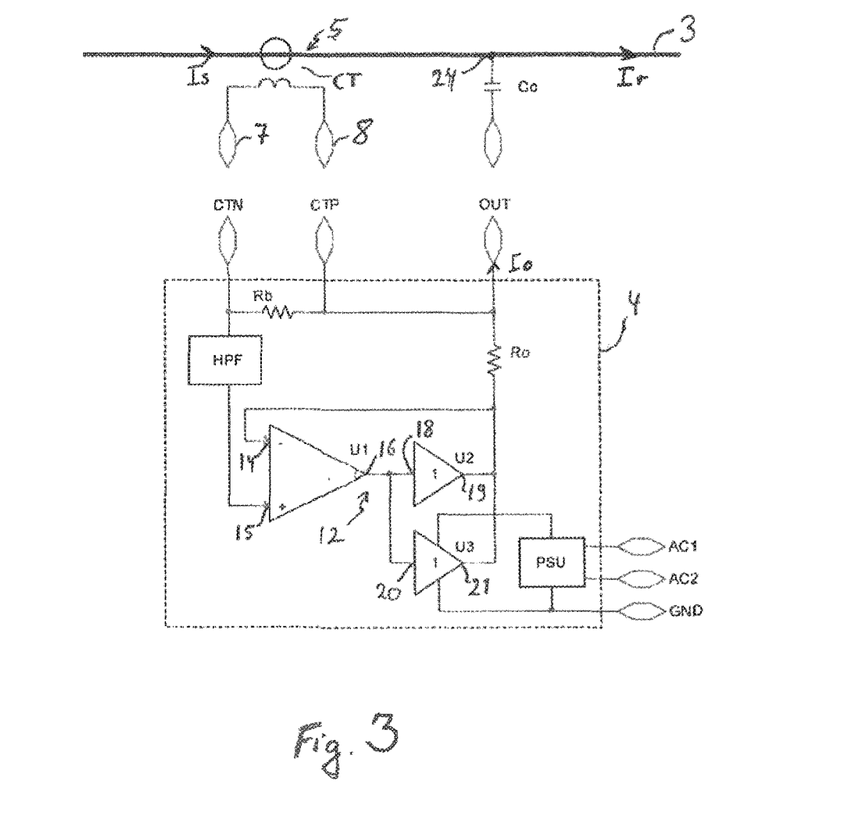
FIG. 3 shows a simplified circuit diagram of current cancellation on a power line 3.

FIG. 3 shows an embodiment of a simplified circuit diagram of current cancellation of a power line 3. The current cancellation is performed by an active filter device 4 which may be embodied as a module and further components that are coupled between the power line 3 and the filter device 4.

The current cancellation circuit comprises a current sensor 5 including a current transformer CT. Typically it has secondary turns N=100. The current transformer CT comprises terminals 7, 8 that are connected to the filter device 4.

The filter device 4 has sensor terminals CTN, CTP for applying a sensor signal depending on a noise current Is on the power line 3; the sensor 5 providing the sensor signal. Furthermore, there is an output terminal OUT and a terminal for applying a reference potential GND. Power supply means terminals AC1, AC2 allow applying power supply for the active components to the filter device 4.

The current cancellation circuit comprises a high-pass filter HPF, an amplifier means 12 and a power supply unit PSU.

The high-pass filter HPF is coupled between one sensor terminal CTN and amplifier means 12.

The amplifier means 12 being a unity gain amplifier means comprises an operational amplifier U1, and two buffer amplifiers U2, U3. The operational amplifier U1 has a non-inverting input 15, an inverting input 14, and an output 16. Each buffer amplifier U2, U3 has an input 18, 20 and an output 19, 21. The inputs 18, 20 are coupled to the output 16 of the operational amplifier U1 and the outputs 19, 21 are coupled to the inverting input 14 of the operational amplifier U1, thereby the buffer amplifiers U2, U3 are connected in parallel. The non-inverting input 15 is coupled to the high-pass filter HPF.

The outputs 19, 21 of the buffer amplifiers U2, U3 are coupled via a resistor Ro with the output OUT of the filter device 4.

A power supply unit PSU is coupled to the power supply means terminals AC1, AC2 and the amplifier means 12. The power supply means terminals AC1, AC2 and the amplifier means 12 are also connected with the terminal for applying a reference potential GND. Alternatively the power supply PSU may be removed from the filter device 4, whereby dc power for the amplifier means 12 is provided from a separate or external auxiliary power source.

A resistor serving as burden resistor Rb is coupled between the sensor terminals CTN, CTP. One sensor terminal CTP is connected to the output OUT.

The output terminal OUT is coupled via a coupling capacitance Co to the power line 3. The connection of the power line 3 and the capacitance's terminal serves as summing point 24 at which the noise current Is and the correction current Io provided by the filter device 4 are summed. Capacitor Co provides safety isolation of the power line to earth.

The terminals 7, 8 of the current transformer CT are connected with the sensor terminals CTN, CTP of the filter device 4, where the current transformer CT is terminated in the burden resistor Rb which may have a typical resistance of 220R.

The voltage across the burden resistor Rb passes via the high-pass filter HPF and the unity gain amplifier means 12, which comprises the operational amplifier U1 and the buffer amplifiers U2, U3.

In the pass band, the voltage across the output resistor Ro, which may have a typical value of 2.2R, and the burden resistor Rb is equal.

The correction current Io is given in terms of the sensed current Is by the expression Io=Is Rb/(N Ro), wherein the values for Rb, N and Ro are chosen to achieve equal noise and compensation currents, i.e. Io≈Is. Typical values of the components have been given above.

The amplifier means 12 is a high quality, wide band, unity gain amplifier means, formed from the operational amplifier U1 with a very high gain-bandwidth product, typically 200 MHz, and the buffer amplifiers U2 and U3 with bandwidths of about 180 MHz. The buffer amplifiers U2 and U3 are connected in parallel to increase the drive current.

The outputs 19, 21 of the buffer amplifiers U2 and U3 are connected to the inverting input 14 of the operational amplifier U1 so that their outputs 19, 21 exactly follow the non-inverting input 15 of the operational amplifier U1.

The high gain of the operational amplifier U1 and the wide bandwidth of all components ensure that not only wide band current cancellation, but also a high quality, linear and noise free resulting current Ir is achieved. The wide bandwidth enables satisfactory results to be achieved.

Figure 4:
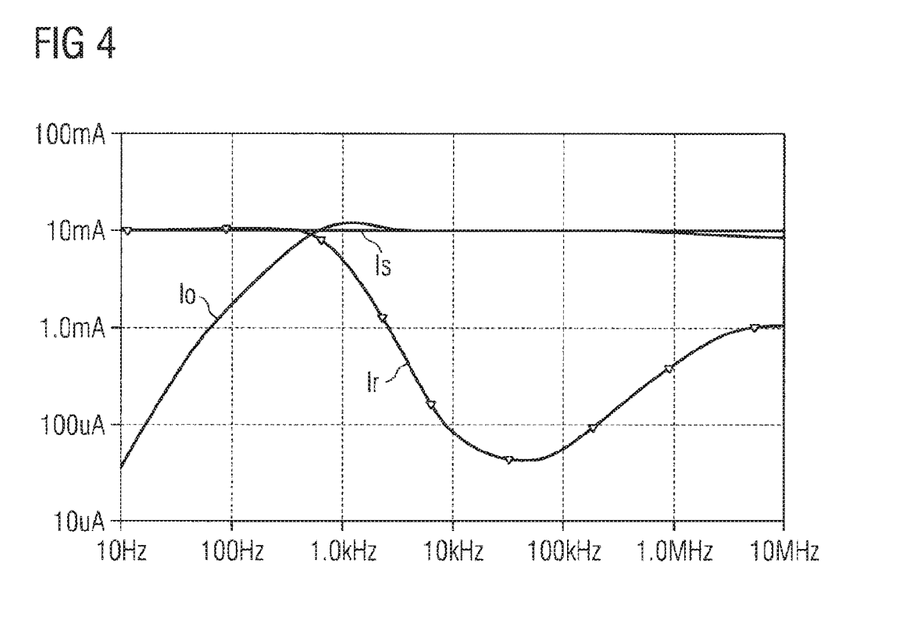
FIG. 4 shows the frequency response of an embodiment of a high-pass filter.

FIG. 4 shows the frequency response of the high pass filter HPF. The diagram shows the currents Is, Io and Ir in dependence of frequency. The axes of the diagram are logarithmic.

A sensed current Is of 10 mA is applied and the responding output current Io and resulting current Ir are measured. The sensed current Is is a constant line in the diagram.

In this configuration, the corner frequency of the high-pass filter HPF is chosen to be 800 Hz resulting in a ratio of Ir/Is equal to 0.01 at 8 kHz giving a corresponding attenuation of 40 dB. The corner frequency can be selected at other frequencies and is typically selected to give 40 dB at the fundamental of the switching frequency, which may be typically equal or larger than 4 kHz.

The shape of the resulting current Ir should be mentioned. Of particular importance is the low frequency rejection in the stop band, the corner frequency without ringing (critically damped) and the sharp roll-off above corner frequency, which is about 40 dB/dec. Furthermore, a good attenuation, which is larger than 40 dB, extends well above 150 kHz, thus providing attenuation enhancement in the EMC band as well as at the switching fundamental.

Figure 5:
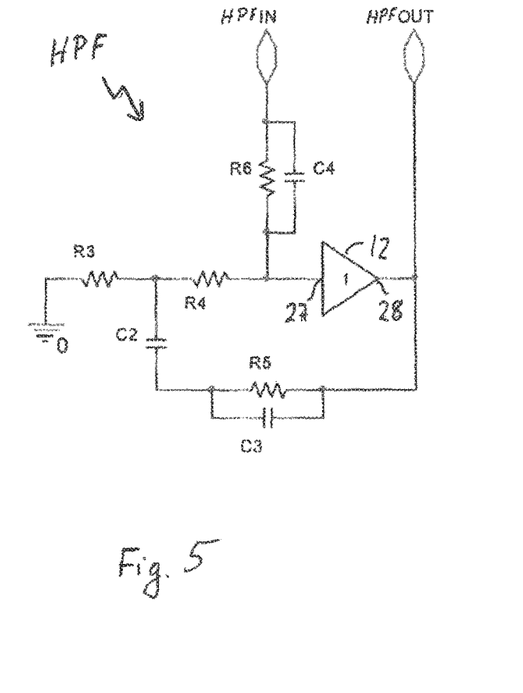
FIG. 5 shows a circuit diagram of an embodiment of a high-pass filter

FIG. 5 shows an exemplary circuit diagram in detail of the high-pass filter HPF having a filter input HPFIN for being coupled to the sensor terminal CTN. The output HPFOUT may be coupled to the output terminal OUT. The high-pass filter HPF is coupled to the amplifier means 12 and has an input 27, which may be the non-inverting input 15, and an output 28, which may be the buffer outputs 19, 21. The input HPFIN is connected with the input 27 of the amplifier means 12 via a resistor R6 and a capacitor C4 that are connected in parallel. The output 28 of the amplifier means 12 is connected with the input 27 via a series connection of a resistor R5 and a capacitor C3 coupled in parallel, a capacitor C2 and a resistor R4. A resistor R3 is connected with the resistor R4 and a reference potential.

The high-pass filter HPF filters the sensor current. In order to achieve a suitable shape for the residual current Ir the high-pass filter HPF includes a bootstrap connection, where the amplifier output 28 is fed back to its input 27 via the dc blocking capacitor C2 and a suitable RC network which is formed by the resistor R5 and the capacitor C3. Exemplary values of the components may be R3=220 kΩ, R4=220 kΩ, R5=15 kΩ, R6=56 kΩ, C2=3.3 μF, C3=1 nF, and C4=2.2 nF.

Figure 6:
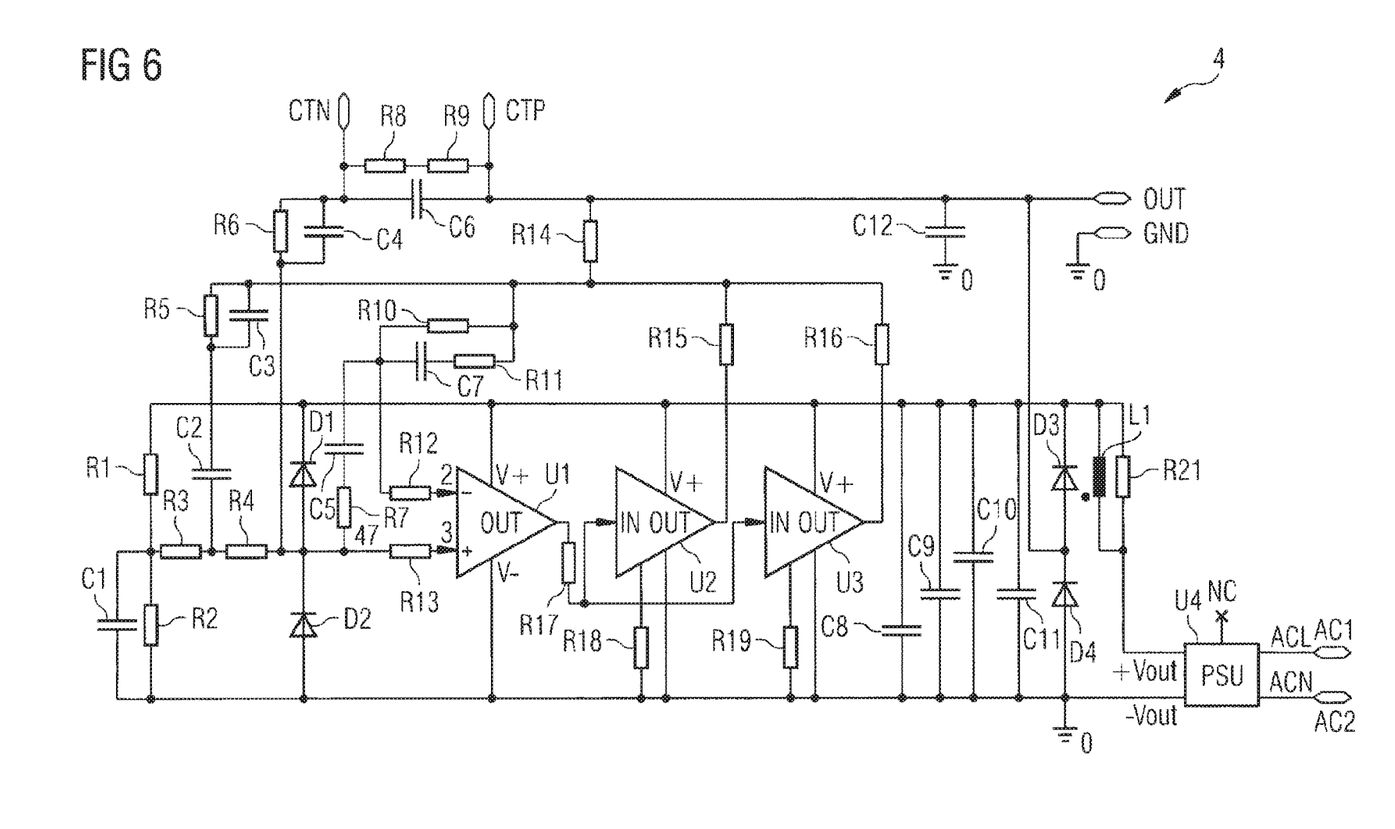
FIG. 6 shows an embodiment of the filter device in more detail.

FIG. 6 shows an embodiment of the filter device 4 in more detail. The filter device 4 includes the sensor terminals CTN, CTP, the output terminal OUT, the power supply means terminals AC1, AC2 and the terminal for applying a reference potential GND.

The filter device 4 also comprises a high-pass filter HPF including the components R6, C4, R4, R3, C2, R5, and C3 being coupled as described in connection with FIG. 4.

Furthermore, the filter device 4 comprises an operational amplifier U1 being coupled with the buffer amplifiers U2, U3 forming the amplifier means 12 as described in connection with FIG. 3. The power supply unit PSU supplies the amplifiers U1, U2, U3. The filter device 4 also includes diodes D1, D2, D3, D4 for protecting the amplifier from line disturbance.

Further inductive, capacitive and resistive impedances allow improved filtering and stabilise the operation of the components according to the basic principles as described in connection with the previous figures.

Figure 7:
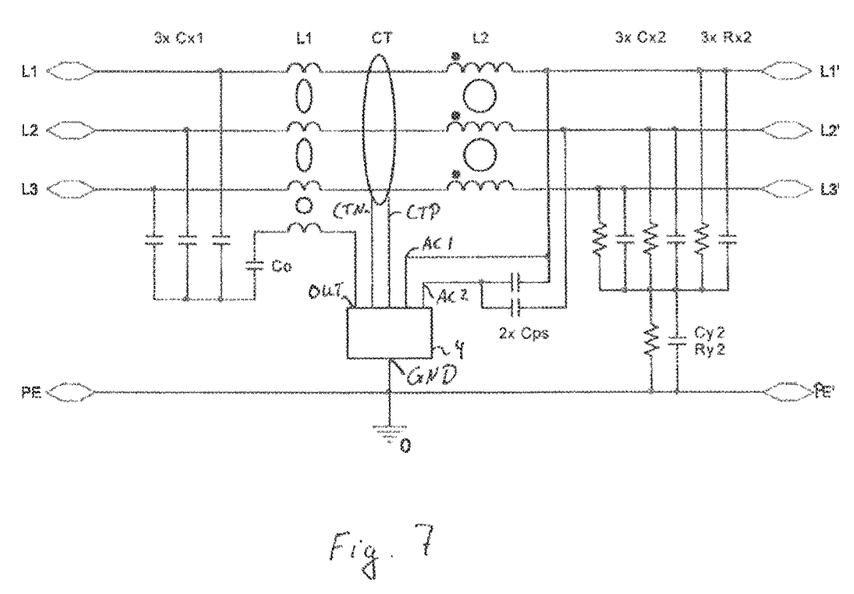
FIG. 7 shows a circuit diagram of an embodiment of an arrangement including the filter device being part of a three-phase ac line filter.

FIG. 7 shows a circuit arrangement including the filter device 4 being part of a three-phase ac line filter. In this embodiment, the filter device 4 is embodied as a module, which is connected with the other components of the circuit arrangement. This circuit arrangement forms a three-phase hybrid filter with a common mode attenuation boost.

The circuit arrangement is coupled between the lines L1, L2, L3 of a power supply network and the electrically operated appliance L1', L2', L3' or load. Furthermore, there is a reference line PE/PE' connected with the reference potential.

The appliance may produce undesired noise, switching pulses, spikes, and high frequency noise. These effects should be filtered out in order to comply with electromagnetic compatibility specifications.

The sensing device is a current transformer CT and the necessary active filter device electronics are all integrated into a self-contained component block forming the filter device module. The filter device 4 includes the high pass filter HPF, the amplifier means 12 and the auxiliary power supply unit PSU as described in connected with the previous figures.

The blocking capacitor Co connected downstream to the output OUT of the filter device 4 provides power line voltage isolation. The combination of two capacitors Cps form a voltage divider to produce a suitable input voltage for the power supply unit PSU.

The remaining components may be those typically found in a passive line filter. The passive filter section includes a low-pass filter formed by inductive components L2. Furthermore, there an arrangement of capacitors Cx1 and an arrangement of capacitors Cx2 and resistors Rx2 connected in parallel. The neutral point of the arrangement of the capacitors Cx2 and the resistors Rx2 is connected with the reference potential by a parallel connection of a resistor Rye and a capacitor Cy2. Other arrangements are possible. The inductance L1 is typically a ferrite core with straight-through coupling (N=1) which provides improved immunity from line disturbances.

Figure 8:
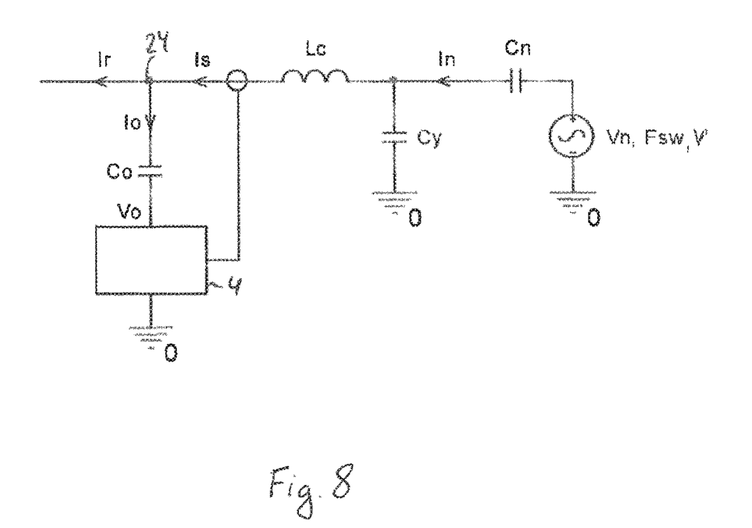
FIG. 8 shows a circuit diagram indicating the application of the filter device.

FIG. 8 indicates an application of the filter device 4 which allows determination of suitable values for the components connected to the filter device 4.

FIG. 8 shows a simplified circuit diagram of a typical system integration of the filter device 4. The sensed current Is and the compensation current Io are added at the summing point 24 in order to reduce the disturbances. The compensation current Io flows via a coupling capacitor Co.

The circuit further comprises a voltage source Vn for generating a signal, which is characterised by the voltage V and the frequency Fsw, and a capacitor Cn downstream to the voltage source Vn. The circuit further comprises a line-to-ground capacitor Cy coupled in parallel with the voltage source Vn and the capacitor Cn. Furthermore, there is an in-line inductive impedance Lc.

Suitable values of the components Cy, Lc and Co, to cope with the disturbing noise current In, depend on the values of Cn, V and Fsw characterising the disturbance. Furthermore, the values of the predicted compensation current Io and voltage Vo provided at the output of the filter device 4 must fall within specified limits of the filter device 4.

The resulting current Ir is predicted in such a manner that it falls into an EMI disturbance level which should comply with the necessary EMC and earth leakage current requirements.

The adaption and selection of the components Lc, Co and Cy for a system to be designed may be made from a graph or table which is based on simulation, with varying parameters Fsw, Vn, Cn, or can be made by calculation from a formula. Such adaption and selection result in optimal working conditions and ensure correct operation.

The scope of protection is not limited to the examples given herein above. The invention is embodied in each novel characteristic and each combination of characteristics, which particularly includes every combination of any features, which are stated in the claims, even if this feature or this combination of features is not explicitly stated in the claims or in the examples.

The invention claimed is:

1. An active filter device comprising:
   sensor terminals for applying a sensor signal depending on a sensed noise signal;
   an output terminal for providing a correction signal that is suitable for reducing the noise signal;
   a signal source adapted for generating the correction signal, wherein the signal source comprises a unity gain amplifier, wherein the unity gain amplifier comprises an operational amplifier having a non-inverting input, an inverting input and an output, and wherein the output of the operational amplifier is coupled to the inverting input of the operational amplifier; and
   a high-pass filter coupled between the sensor terminals and the signal source, wherein the high-pass filter is coupled to the non-inverting input of the operational amplifier,
   wherein the correction signal is generated with a dependence on a high-pass filtered sensor signal.

2. The active filter device of claim 1, wherein the noise signal, the correction signal and the signal source are a noise current, a correction current and a current source, respectively.

3. A circuit arrangement connectable between a power supply network and an electrically operated appliance, the circuit arrangement comprising:
   the active filter device of claim 2; and
   a current sensor coupled to the sensor terminals, the current sensor comprising a current transformer.

4. The circuit arrangement of claim 3, wherein the output terminal is coupled with a summing point between the current transformer and a connection to the power supply network or to the electrically operated appliance.

5. The circuit arrangement of claim 3, wherein the power supply network is one of a dc power line, an ac power line, a single phase power line, and a multiple phase power line.

6. The active filter device of claim 1, wherein the noise signal, the correction signal and the signal source are a noise voltage, a correction voltage and a voltage source, respectively.

7. The active filter device of claim 1, wherein the active filter device is a feed-forward control, wherein the signal source is controlled in a manner that the correction signal compensates or nearly compensates the noise signal.

8. The active filter device of claim 1, wherein a buffer amplifier or a multitude of buffer amplifiers that are coupled in parallel are coupled between the output and the inverting input of the operational amplifier.

9. The active filter device of claim 1, wherein the high-pass filter comprises a bootstrap connection.

10. The active filter device of claim 9, wherein the bootstrap connection comprises a dc blocking capacitor coupled in series with a resistor and a capacitor that are coupled in parallel.

11. The active filter device of claim 9, further comprising:
a power supply unit coupled to the unity gain amplifier; and
power supply terminals for applying a voltage to the power supply unit.

12. An active filter device comprising:
sensor terminals for applying a sensor signal depending on a sensed noise signal;
an output terminal for providing a correction signal that is suitable for reducing the noise signal;
a signal source adapted for generating the correction signal, wherein the signal source comprises a unity gain amplifier, wherein the unity gain amplifier comprises an operational amplifier having a non-inverting input, an inverting input and an output, and wherein the output of the operational amplifier is coupled to the inverting input of the operational amplifier; and
a high-pass filter coupled between the sensor terminals and the signal source, the high-pass filter coupled to the non-inverting input of the operational amplifier, the high-pass filter comprising a bootstrap connection that comprises a dc blocking capacitor coupled in series with a resistor and a capacitor that are coupled in parallel, and wherein the correction signal is generated with a dependence on the high-pass filtered sensor signal.

* * * * *